United States Patent

Kato et al.

[11] Patent Number: 5,685,684
[45] Date of Patent: Nov. 11, 1997

[54] VACUUM PROCESSING SYSTEM

[75] Inventors: Shigekazu Kato; Naoyuki Tamura, both of Kudamatsu; Kouji Nishihata, Tokuyama; Tsunehiko Tsubone, Hikari; Atsushi Itou, Kudamatsu; Kenji Nakata; Yoshifumi Ogawa, both of Hikari, all of Japan

[73] Assignee: Hitachi, Ltd., Tokyo, Japan

[21] Appl. No.: 612,465

[22] Filed: Mar. 7, 1996

Related U.S. Application Data

[60] Division of Ser. No. 457,595, Jun. 1, 1995, which is a continuation-in-part of Ser. No. 131,911, Oct. 4, 1993, Pat. No. 5,445,484, which is a continuation of Ser. No. 796,672, Nov. 25, 1991, abandoned.

[30] Foreign Application Priority Data

Nov. 26, 1990 [JP] Japan ................ 2-317810
Jun. 13, 1994 [JP] Japan ................ 6-130124

[51] Int. Cl.⁶ ...................................... B65H 5/08
[52] U.S. Cl. ............... 414/217; 414/416; 414/937; 414/939; 414/940; 118/719; 364/478
[58] Field of Search ............... 414/217, 937, 414/225, 222, 331, 223, 938, 416, 417, 786, 935, 939, 940, 941, 273, 274, 275; 204/298.25; 118/719; 364/478

[56] References Cited

U.S. PATENT DOCUMENTS

| | | | |
|---|---|---|---|
| 4,746,256 | 5/1988 | Boyle et al. | 414/217 |
| 4,759,681 | 7/1988 | Nogami | 414/937 X |
| 4,808,059 | 2/1989 | Eddy | 414/937 X |
| 4,836,733 | 6/1989 | Hertel et al. | 414/937 X |
| 4,895,486 | 1/1990 | Baker et al. | 414/273 X |
| 4,932,828 | 6/1990 | Katae et al. | 414/331 X |
| 4,951,601 | 8/1990 | Maydan et al. | 414/217 X |
| 5,314,509 | 5/1994 | Kato et al. | |
| 5,349,762 | 9/1994 | Kato et al. | |

FOREIGN PATENT DOCUMENTS

| | | | |
|---|---|---|---|
| 55-162231 | 12/1980 | Japan . | |
| 60-74531 | 4/1985 | Japan . | |
| 139341 | 6/1987 | Japan | 414/937 |
| 145831 | 6/1987 | Japan | 414/938 |
| 63-211645 | 9/1988 | Japan . | |
| 63-273331 | 11/1988 | Japan . | |
| 288139 | 11/1990 | Japan | 414/937 |
| 34441 | 2/1991 | Japan | 414/937 |

*Primary Examiner*—Frank E. Werner
*Attorney, Agent, or Firm*—Antonelli, Terry, Stout & Kraus, LLP.

[57] ABSTRACT

A vacuum treating apparatus having a vacuum treating chamber for treating a to-be-treated substrate in vacuum, includes a plurality of substrate cassettes which are installed in the open air and hold substrates that are to be conveyed into the vacuum treating chamber, a device for conveying the substrates between the substrate cassettes and the vacuum treating chamber, and a device which selects either that the to-be-treated substrate after treated in the vacuum treating chamber be held in the substrate cassette from which the to-be-treated substrate was taken out or that the to-be-treated substrate after treated in the vacuum treating chamber be held in another substrate cassette which is different from the substrate cassette.

4 Claims, 4 Drawing Sheets

VACUUM PROCESSING SYSTEM

CROSS REFERENCE TO RELATED APPLICATION

This is a division of application Ser. No. 08/457,595, filed Jun. 1, 1995, which in turn is a continuation-in-part of patent application Ser. No. 08/131,911 filed on Oct. 4, 1993, now U.S. Pat. No. 5,445,484 issued Aug. 29, 1995, which in turn is a continuation application of patent application Ser. No. 07/796,672 filed on Nov. 25, 1991 now abandoned. The contents of above all are herein incorporated by reference.

BACKGROUND OF THE INVENTION

1. Field of the Invention

The present invention relates to a vacuum processing system into which a wafer cassette, which holds a plurality of wafers to be treated, is fed and another wafer cassette into which treated wafers are put is taken out.

2. Description of the Related Art

In a vacuum processing system, such as a dry etching system, CVD system, sputtering system and the like, in general, the operation is as follows: A predetermined number of wafers to be treated are held in a wafer cassette as a single unit (generally called a lot), the wafer cassette which holds the wafers is introduced into the system, and another wafer cassette into which the predetermined number of treated wafers are put is taken out, thus attaining high production efficiency.

One example of the conventional vacuum processing systems is shown in Japanese Patent Unexamined Publication No. 60-74531. In this system, the wafer cassette is placed on the table in the atmosphere, and the loading chamber is brought to atmospheric pressure. A first isolating valve between the loading chamber and the table is opened and a cassette drive unit and a wafer carrier cooperate with each other so that the first wafer to be treated, which is held in the lowest stage of the wafer loading cassette, is fed into the loading chamber. After the first isolating valve is closed and the loading chamber is evacuated, the second isolating valve provided between the loading chamber and a wafer processing chamber is opened, and thus the loading chamber is communicated with the wafer processing chamber. The wafer is moved into the wafer processing chamber, and the second isolating valve is closed so that the desired treatment is performed on the wafer. During this treatment, the loading chamber is returned to atmospheric pressure again and the second wafer to be treated, which is held in the second stage from the bottom of the wafer loading cassette, is fed into the loading chamber. When the treatment of the first wafer is completed, the first wafer is fed into an unloading chamber and the second wafer is fed into the wafer processing chamber. While the second wafer is being treated, the first wafer is put into the uppermost stage of the wafer unloading cassette via the unloading chamber which has been returned to the atmospheric pressure. Other wafers are also treated one by one in the same manner. After the last wafer has been put into the wafer unloading cassette, the wafer unloading cassette is taken out.

The arrangement, however, may be modified when occasion demands such that the wafer is directly fed into the vacuum processing chamber without being passed through the loading chamber. An example of such a modified vacuum processing system is shown in Japanese Patent Unexamined Publication No. 55-162231.

A carrying unit shown, for example in Japanese Patent Unexamined Publication No. 63-273331 is proposed in that it is designed to prevent contamination from generating due to dust, etc. which is stuck to wafers and a wafer cassette at the time that the wafers are carried into a semiconductor production process. In a wafer treatment of this example, when the wafers are carried out from the cassette and are put into the cassette, the cassette stage, on which the cassette is set, is fixed, while a carrying arm is provided in such a manner than it can be moved upwardly, downwardly, rotationally or straightforwardly. At the same time, the drive portion is held inside the cover to comply with the above-described demands.

Another example of the system of the related arts is shown in Japanese Patent Unexamined Publication No. 63-211645. In this example, the cassette is fixed and a mechanism, in which two carrying arms formed on the upper and lower stage are moved upwardly and downwardly, is employed so that the generation of contamination due to dust, etc. can be prevented. At the same time, the carrying arms can access the wafer in the cassette randomly and each of the treated wafers can be fed back to the original position where one of the wafers to be treated was held.

SUMMARY OF THE INVENTION

In recent years, high micronization, integration and density of electronic devices, including semiconductor elements, has become required more and more. There has been a strong tendency to keep a worker out of producing environment, because a man is the greatest factor of the particle-generation which prevents an increase in a yield. Conventionally, in such a production site, workers are engaged in working for transferring products between the systems and between the production lines, for introducing wafers to be treated into the system, and for taking the wafers out. Nowadays most of these works can be conducted by transfer robots. Therefore, the system, in which the transfer robot carries out such working, has been employed. The production system also is required to interface with the transfer robot.

With such automatization of the production line, a production control system is automatized. The system has been used in which production-control information is given to every product carried by the robot, treatment in each process is performed according to the given information, and the treatment records are stored. In the system, though one cassette of products is routinely carried by the robot as one product unit, two cassettes may be carried as one unit or a plurality of product units may be intermingled in one cassette. A production system, therefore, is required to flexibly adapt to user's needs.

The related arts described before will be discussed in the light of the above-described change of the environment. In the first example of the prior art, when a product unit consists of a plurality of cassettes, one both load/unload sides there are required a plurality of cassette moving mechanisms corresponding to the constitution. Accordingly, problems that the construction is complicated and the cost is increased are brought up. All the wafers held in the cassette, whether they have been treated or not, are required to move whenever one wafer is taken in and out of the cassette. Therefore, problems that dust is generated and sticks to the wafer cannot be avoided.

In view of the above-described problems, the system shown in Japanese Patent Unexamined Publication No. 63-273331 is intended to simplify the system and solve the problem of dust-generation by fastening the cassette. However, even though this system is formed in combination with a system such as the first example of the prior arts, the following problems remain unsolved.

That is, in the above-described prior arts, the wafer loading cassette, which is set on the introducing side and holds the wafers to be treated, and the wafer unloading cassette, which is set on the taking-out side and is empty, are always required to be introduced and taken out in pairs. The treated wafers are held in the wafer unloading cassette in reverse order in which the wafers are held in the wafer loading cassette. Therefore, in order to adapt to an ordinary method in which production information is given to every cassette, the treated wafers are required to be transferred again from the wafer unloading cassette which once holds the treated wafers to the wafer loading cassette which has become empty. There have been problems in which not only the number of steps increases but also the yield deteriorates due to dust-generation. Viewed at operational efficiency of the system, there is caused inconvenience in which the new introduction of wafers must be waited, or the processing of the newly introduced wafers must be suspended until all the wafers which have been introduced from the wafer loading cassette are put into the wafer unloading cassette and the next empty cassette is set.

Even in treating the product wafers, furthermore, if the wafers after treated are held in the same cassette, dust may be transferred from the treated wafers to the untreated wafers, which is not desirable for some products.

Furthermore, the system for introducing and recovering the wafers into and out of the apparatus is equipped with either the cassettes exclusively for introducing the wafers and the cassettes exclusively for recovering the wafers or the cassettes for both introducing and recovering the wafers. In such cases, however, the efficiency for utilizing the apparatus decreases depending upon the system of the production line or the contents for treating the wafers being limited by the timing for introducing the cassette, and it is not allowed to selectively cope with the problems such as foreign matters falling onto the untreated wafers from the treated wafers.

In order to take out the wafers from the cassette, furthermore, a conventional mechanism for handling the wafer was so far inserted in a fixed position of the cassette without, however, being able to maintain space between the wafer and the handling mechanism. Therefore, the lower surface of the wafer was brought into contact with the handling mechanism, causing foreign matters to be produced.

On the other hand, the system shown in Japanese Patent Unexamined Publication No. 63-211645 has achieved to solve the above-described problems as follows. The system has a mechanism in which the cassette is fixed and two carrying arms positioned on the upper and lower stages operate upwardly and downwardly, so than the arms can randomly access the wafers in the cassette and the treated wafers can be transferred into the original position where the wafers were held before the treatment. However, there is no consideration for an interface between the transfer robot and the system/process according to the automatization of the production line.

In this conventional system, when a plurality of cassettes are introduced into the system, the cassettes are required to be set in the upper and lower two stages or more. Therefore, the system contains the following disadvantages. The transfer robot on the line needs a complicated operation. Further, it is impossible to take out the cassette which is set in the lower side unless the upper side cassette has been taken out. Even though a plurality of the cassettes are introduced, the system needs a long dead time (system-inoperative time for cassette replacement).

An object of the present invention is to provide a vacuum processing system which can be easily adapted to automatization of the production line and can decrease contamination of products due to dust-generation, etc., while realizing high production efficiency and a high product yield.

To achieve the above-described objects, the present invention provides a vacuum processing system which has a plurality of wafer cassettes, each holding a plurality of wafers to be treated on the substantially horizontal flat surface in the atmospheric pressure. Further, each of the wafer cassettes has upper and lower stationary positions and the wafers are taken in and out of the cassette which is set either the upper or lower stationary positions.

The object of the present invention is to provide a vacuum treating apparatus which is capable of selecting a wafer conveyer system that is free from the above-mentioned problems, prevents the decrease of the apparatus's utilization efficiency as it is limited by the timing for introducing the cassette as determined by the type of the production line, and reduces the effects upon the untreated wafers caused by foreign matters that fall thereon from the treated wafers depending upon the content of treating the wafers.

In order to achieve the above-mentioned object, the present invention deals with a vacuum treating apparatus, in which means for holding the substrates to be treated is provided with a function which sets this means to work exclusively for conveying the substrate into the vacuum treating chamber or to work exclusively for conveying the substrate out of the vacuum treating chamber.

In taking the wafers out of the cassette, furthermore, the mechanism for handling the wafer is not inserted in a fixed position of the cassette, but predetermined space is maintained between the wafer and the handling mechanism, so that the lower surface of the wafer will not come into contact with the handling mechanism.

By maintaining space constant between the wafer and the handling mechanism, the lower surface of the wafer is not brought into contact with the handling mechanism, and foreign matters are produced in reduced amounts by the handling of the wafer.

That is, means for holding the substrates to be treated can be used for a plurality of applications, and makes it possible to select cassettes and the wafer conveying system that meet the production lines. Even in treating the product substrates, the untreated substrates are little affected by dust that results from the handling of wafers and from the treated substrates.

DETAILED DESCRIPTION OF THE PREFERRED EMBODIMENT

One embodiment of the present invention is described below with reference to FIGS. 1 and 2.

Figure 1:
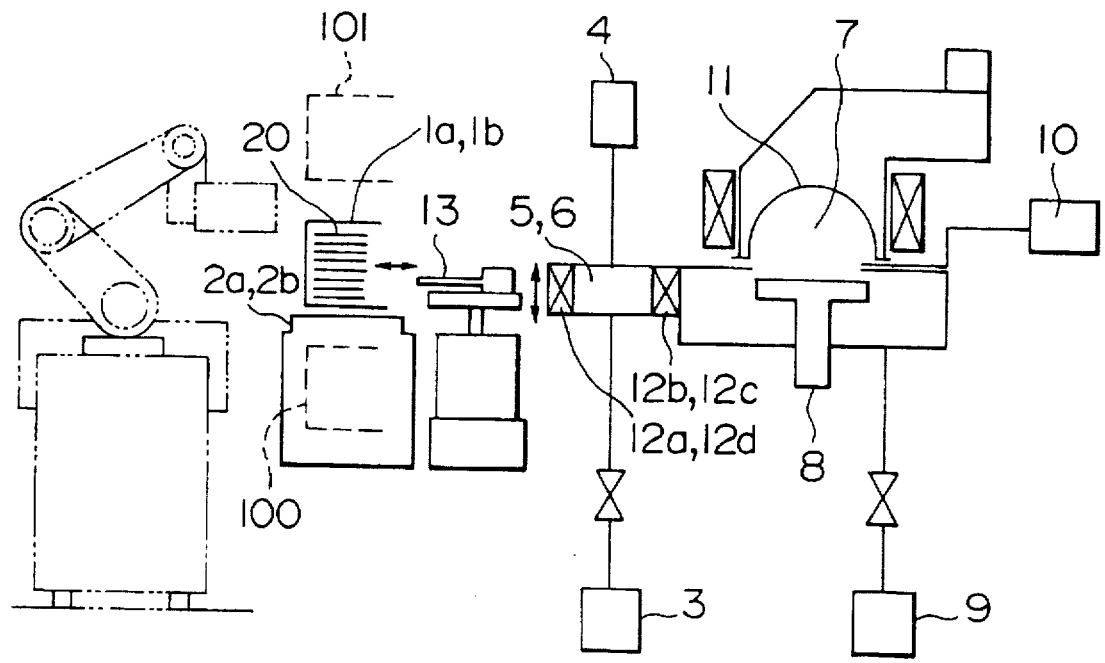
FIG. 1 is a front view of a dry etching system according to one embodiment of the present invention.
Figure 2:
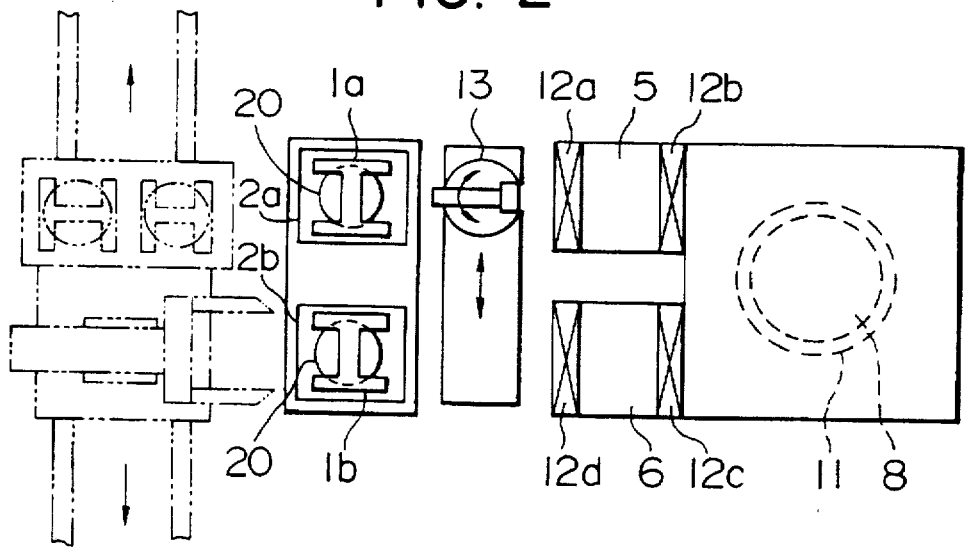
FIG. 2 is a plan view of the system shown in FIG. 1.

FIG. 1 shows an application of one example of a vacuum processing system according to the present invention which performs dry etching of a semiconductor wafer. FIG. 2 is a plan view of the system shown in FIG. 1.

The vacuum processing system comprises: a plurality of cassettes 1a and 1b, each of which can hold a plurality of wafers (normally twenty-five wafers), for containing and putting processing objects (wafers to be treated) into the system and for containing again the treated wafers to the original position in the cassette where the wafers are held before treatment; and, cassette stands 2a and 2b, on which the cassettes 1a and 1b are disposed, for determining positions in which the cassettes are taken into and out of the system. Further, the vacuum processing system comprises: a load-lock chamber 5 for introducing the wafer to be created into a vacuum atmosphere provided with a vacuum evacuation unit 3 and a gas-feeding unit 4; an unload-lock chamber 6 for taking out the treated wafer into the atmosphere; an etching treatment chamber 11 includes an electric discharging portion 7 for performing etching on the wafer, a wafer stage 8, a vacuum-evacuation system 9 and a gas-feeding unit 10; isolation valves 12 capable of hermetically separating each of the chambers; a transfer unit 13, provided with a robot having X, Y, Z, and θ axes and disposed between the load-lock chamber 5/unload-lock chamber 6 and the cassettes 1a/1b, for transferring a wafer between the load-lock chamber 5/unload-lock chamber 6 and the cassettes 1a/1b.

Operation of the vacuum processing system will now be described. Firstly, the cassettes 1a and 1b which hold wafers to be treated are supplied from a stocker to the system by a transfer robot or an operator and they are disposed on the cassette stands 2a and 2b. At this time, since the cassette stands 2a and 2b are positioned on the same plane which is approximately level the operation for supplying the cassettes is simplified to make it easy to adapt this system to automatization of the production line. Alternatively, the system can treat the wafer due to realizing itself the production information given to the cassette, or depending on the information sent from master controller or a command input by an operator.

At least one wafer 20 to be treated which is held in the cassette 1a is taken out by the transfer unit 13 and is supplied, through the isolation valve 12a, into the load-lock chamber 5, which is disposed on an opposite side of the transfer unit to the cassette 1a transfer unit. The wafer 20 may be any one of the wafers held in the cassette 1a. The wafer 20 is completely cut off from the atmosphere of the exterior of the system after the wafer 20 has been fed into the load-lock chamber 5 through the isolation valve 12a until the same is put out through the unload-lock chamber 6 through the isolation valve 12d. Therefore, partitions are provided on the position of the isolation valves 12a and 12d as a boundary line so that the cassette stands 2a and 2b, the cassettes 1a and 1b positioned on the cassettes stands, and the transfer unit 13 can be disposed on the clean-room having high purity of air, while other portions of the system are disposed in the maintenance room having comparatively low purity of air. After the isolation valve 12a is closed, the load-lock chamber 5 is evacuated to a predetermined pressure by the vacuum evacuation unit 3. Then, the isolation valve 12b is opened and the wafer 20 is fed into the etching chamber 11, and is placed on the wafer stage 8.

A first wafer 20, which has been fed into the etching chamber 11, is etched under predetermined conditions. Meanwhile, the pressure in the load-lock chamber 5 is reset to atmospheric pressure by the gas-feeding unit 4, with the isolation valves 12a and 12b being closed. Then, a second wafer is fed by the tansfer device 13 into the load-lock chamber 5 through the isolation valve 12a which in now opened, as is the case of feeding the first wafer. The load-lock chamber 5 is evacuated to a predetermined pressure by the vacuum evacuation unit 3. When etching of the first wafer 20 is completed, the isolation valve 12c is opened and the treated wafer 20 is transferred into the unload-lock chamber 6. Then, the isolation valve 12c is closed and the isolation valve 12b is opened so that the second wafer is fed into the etching chamber 11 from the load-lock chamber 5 and the etching treatment begins after the isolation valve 12b is closed.

After the pressure in the unload-lock chamber 6 is reset to the atmospheric pressure, the treated wafer 20, which has been transferred into the unload-lock chamber 6, is brought into the atmosphere by the transfer unit 13 through the isolation valve 12d so that the treated wafer 20 is returned to original position in the cassette 1a where the wafer 20 was first held.

The described operation is repeated so that the vacuum treatment is completed on all the wafers which were held in the cassette 1a and the treated wafers are returned to the original positions, whereby the cassette 1a becomes ready to take out and is replaced with another cassette which holds untreated wafers. Meanwhile, the system continues to treat the untreated wafers in the cassette 1b. It will be seen that the system operates without stopping provided that a next, i.e., a third, cassette is fed before completion of treatment of all the wafers which were held in the cassette 1b.

In the event that the cassette 1b causes an impediment to the operation for taking out the cassette 1d, partly because of a restriction in the degree of freedom of movement of the cassette supply/take-out robot on the production line and partly because of the positioning of both cassettes 1a and 1b on the same horizontal flat planes, it is advisable to retract the cassette 1b to a retracted position 100 of a level below the level of the cassette 1a or a retracted position 101 of a level above the level of the cassette 1a. The transference of the cassette 1b to the retracted position does not require any pitch operation as required in an ordinary cassette elevator, so that resetting of the cassette from the retracted position to the original position can be conducted promptly, without substantially affecting the operation of the transfer device 13 making access to the cassette 1b.

As has been described, according to the present invention, it is possible to easily supply and take-out the substrate cassette by a transfer robot and to continuously treat wafers. The vacuum processing system of the present invention, therefore, can easily be adapted to the automatization of a production line. In addition, the distance to be traveled by each wafer is minimized so that generation of dust also is minimized, thus ensuring a higher yield of the products.

A second embodiment of the present invention will now be described with reference to FIGS. 3 to 6.

Figure 3:
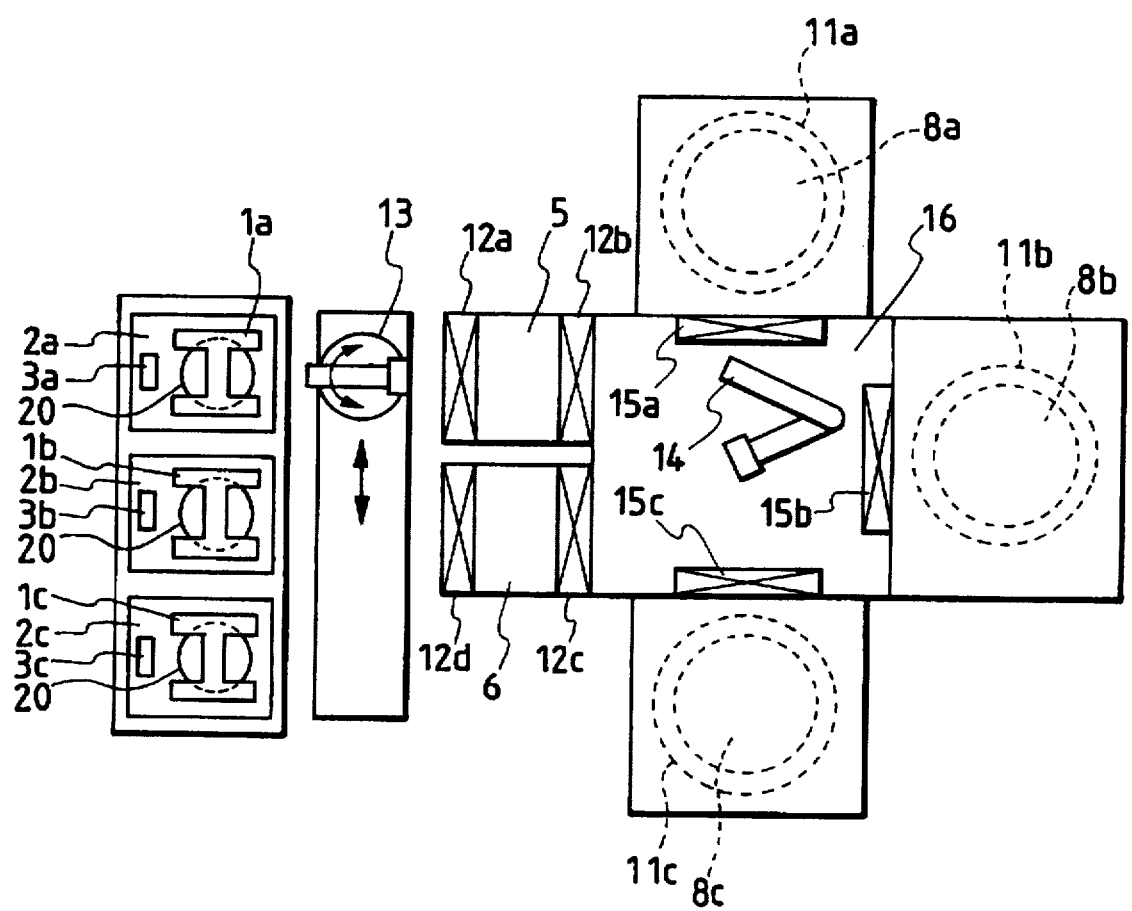
FIG. 3 is a plan view illustrating a dry etching apparatus which is a second embodiment of the vacuum treating apparatus of the present invention.

FIG. 3 is a diagram of a vacuum treating apparatus of the present invention that is applied to an apparatus that dry-etches the semiconductor wafers.

Figure 4:
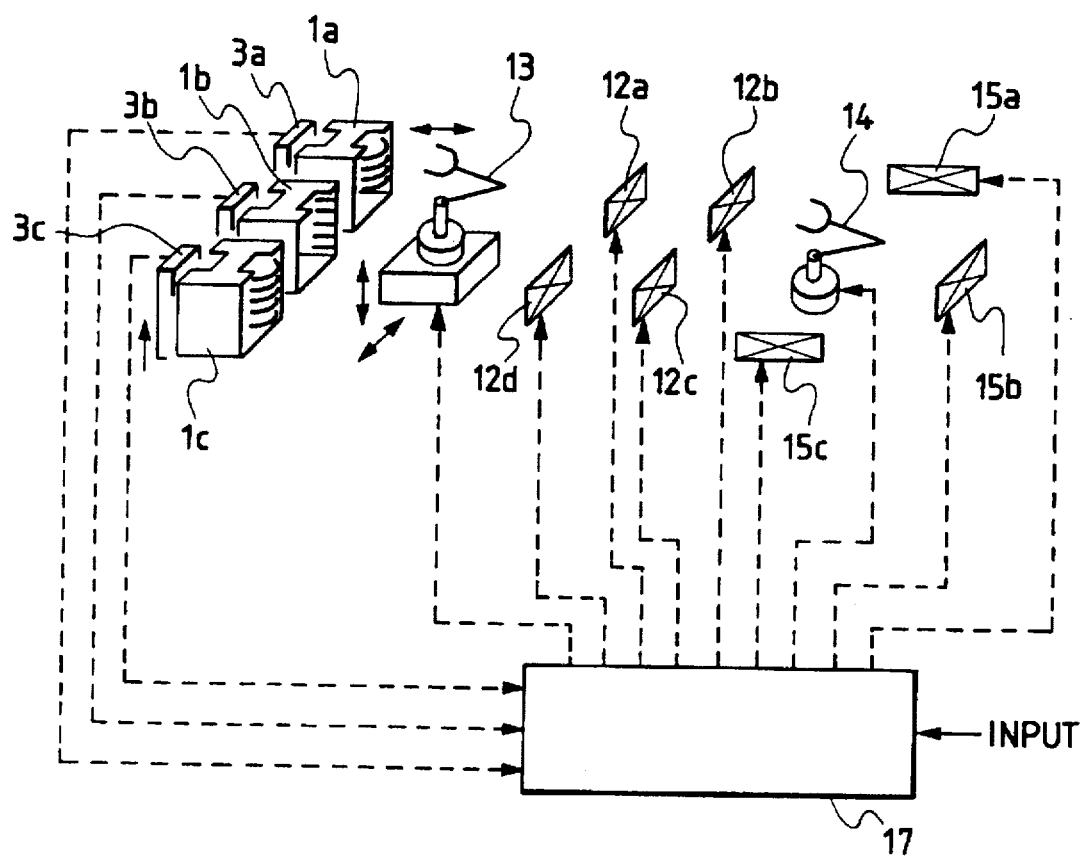
FIG. 4 is a view showing a relation between moving portions in carrying wafers in FIG. 3 and a control unit 17 for controlling the moving portions.

FIG. 4 is a view showing a relation between moving portions in conveying wafers in FIG. 3 and a control unit for controlling the moving portions.

The apparatus comprises a plurality of cassettes 1a, 1b, 1c capable of holding a plurality (25 pieces) of wafers to feed the objects to be treated to the apparatus and to recover the treated wafers and hold them again at the initial positions, cassette plates 2a, 2b, 2c for placing said cassettes, 1a, 1b, 1c and for determining the positions of the cassettes that are introduced into the apparatus or taken out from the apparatus, the cassette plates 2a, 2b, 2c being secured at predetermined positions on a horizontal plane or on a plane close to horizontal plane at all times without changing their positions or attitudes, mapping devices 3a, 3b, 3c for detecting the positions of wafers in the cassettes 1a, 1b, 1c, a load lock chamber 5 equipped with an evacuating device and a gas introduction device that are not shown and for introducing the wafers into vacuum state, an unload lock chamber 6 for taking out the wafers into the open air, etching chambers 11a–11c for etching the wafers, a gate valve values 15a–15c capable of air-tightly isolating them, and a conveyer device 13 for exchanging the wafers between the load lock chamber 5/unload lock chamber 6 and the cassettes 1a, 1b, 1c, the conveyer device 13 being disposed between the load lock chamber 5/unload lock chamber 6 and the cassettes 1a, 1b, 1c and further being provided with a robot that has X-, Y-, Z- and θ-axis. The load lock chamber 5/unload lock chamber 6 are vacuum pre-chambers.

The load lock chamber 5 and the unload lock chamber 6 are connected to a transfer chamber 16 through the gate valves 12b and 12c. The transfer chamber 16 is rectangular, in this case, and etching chambers 11a, 11b and 11c are disposed on the three side walls of the transfer chamber 16 through the gate valves 15a, 15b and 15c, respectively. A conveyor 14 capable of delivering the wafers 20 or the dummy wafers from the load lock chamber 5 to the etching chambers 11a, 11b, 11c and of delivering them from the chambers 11a, 11b, 11c to the unload lock chamber 6 is disposed inside the transfer chamber 16.

An example of the operation of the apparatus will now be described. First, the cassettes 1a and 1b holding the untreated wafers are fed by the robot or the operator from a stocker (not shown) to the apparatus, and are placed on the cassette plates 2a and 2b. Since the cassette plates 2a and 2b are on a horizontal flat plane, it is possible to simplify the operation for feeding the cassettes and to easily cope with the automation of the production line. On the cassette plate 2c is placed a cassette 1c holding a dummy wafer. The apparatus treats the wafers by any one of the methods, i.e., by recognizing the production data imparted to the cassettes, or relying upon the data sent from a host controller or relying upon the command input by the operator.

Figure 5A:
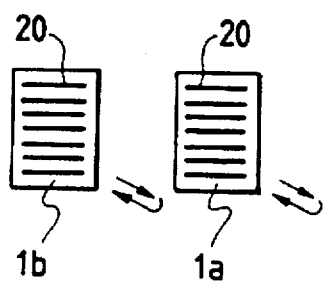
FIGS. 5A, 5B and 5C are views showing a position taking out a wafer from a cassette and a position storing a wafer to a cassette.
Figure 5B:
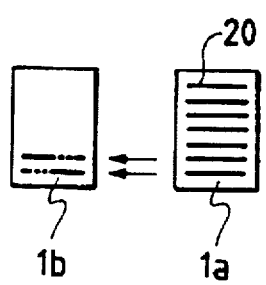
Figure 5C:
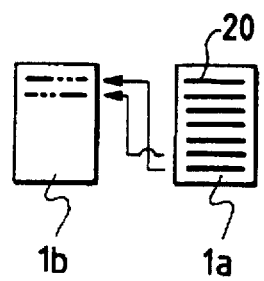

Furthermore, either one of the cassette 1a or 1b may be empty. When the untreated wafers are held in the cassettes 1a and 1b, as shown in FIG. 5A, the wafers taken out from the cassettes 1a and 1b are held again in the initial cassettes. When either one of the cassettes 1a and 1b is empty, however, the wafers after treatment may be held in the initial cassette or may be held in the empty cassette as shown in FIGS. 5B and 5C. The instruction for this operation can be set to the apparatus in a fixed manner or can be set for each of the treatment units.

When the processing is started, first, the state of holding the wafers in the cassette is checked. This is done by moving a wafer-detecting sensor provided for the mapping device 3a up and down along the cassette, and thereby judging the presence of wafers in each of the stages of the cassette relying upon the signals from the sensor. The data related to the presence or absence of wafers can be collated with the data related to wafers in the cassette sent from the host controller. Moreover, the wafer detecting sensor provided for the mapping device 3a is raised along the cassette to check the state where the wafers are stored in the cassette. In this case, when no wafer exists in the cassette, the height of wafer support in each of the stages of the cassette is found based upon a signal from the wafer support detecting sensor provided for the mapping device 3a, and is used as a reference height for recovering the wafers into the cassette.

After the wafer-detecting operation, the untreated wafer 20 held in the cassette 1a is taken out by the conveyer device 13 and is conveyed, through the gate valve 12a, to the load lock chamber 5 that is disposed on the side opposite to the cassette 1a with respect to the conveyer device 13. Here, in taking out the wafer 20 from the cassette 1a by the conveyer device 13, the position for inserting a wafer take-out hand that is not shown in the cassette 1a is determined based upon the data of lower surface position of wafer found at the time of detecting the wafers described above. Furthermore, the operation for taking out the wafer 20 is effected for only those stages of cassette that are determined to have been holding the wafers at the time of detecting the wafers.

The wafer 20 conveyed into the load lock chamber 5 may be the one that is held at any place in the cassette 1a. After having entered into the load lock chamber 5 from the gate valve 12a, the wafer 20 is placed in a state where it is completely shut off from the atmosphere outside the apparatus until it leaves the unload lock chamber 6 through the gate valve 12b. Therefore, a partition is provided with the gate valves 12a and 12b as boundaries; i.e., the cassette plates 2a and 2b, the cassettes 1a and 1b placed thereon, and the conveying device 13 are placed on the side of the clean room having a high degree of purity, and the remaining portions are placed on the side of the maintenance room having a low degree of purity. After the gate valve 12a is closed, the load lock chamber 5 is evacuated down to a predetermined pressure by the evacuating device. Then, the gate valve 12b is opened, and the wafer 20 is conveyed into the etching chamber 11 and is placed on a sample plane 8.

The wafer 20 conveyed into the etching chamber 11 is subjected to the etching under predetermined conditions. During this period, the load lock chamber 5 is returned back to the atmospheric pressure by the gas introducing device 4 under a condition where the gate valves 12a and 12b are closed. Like the first wafer, the second wafer is conveyed by the conveyer device 13 through the gate valve 12a that is opened, and the interior is evacuated down to a predetermined pressure by the evacuating device. When the etching for the first wafer 20 is finished, the gate valve 12c is opened and the treated wafer 20 is conveyed into the unload lock chamber 6. Then, the gate valve 12c is closed, the gate valve 12b is opened and the second wafer is conveyed from the load lock chamber 5. After the gate valve 12b is closed, the etching is started.

Figure 6:
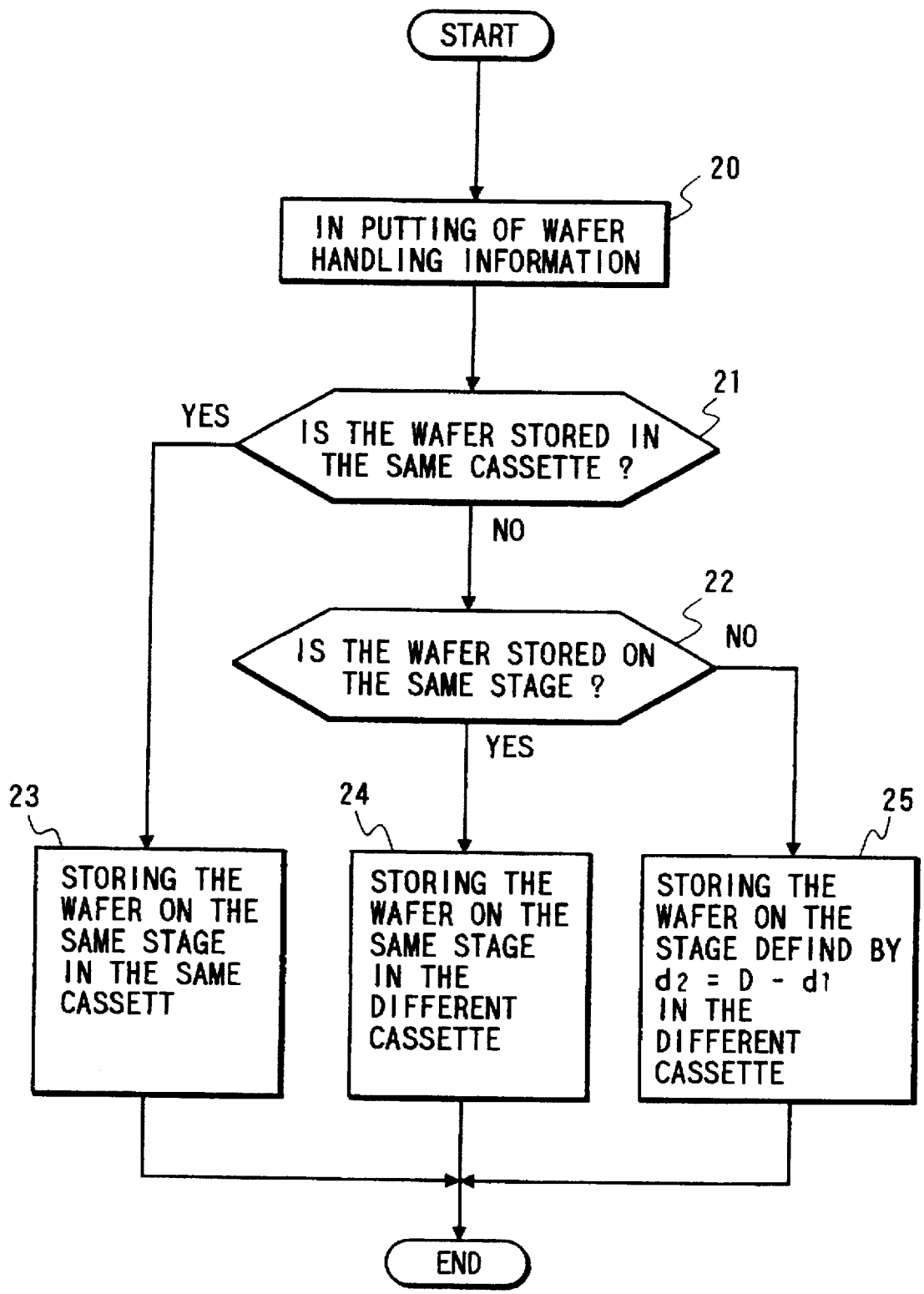
FIG. 6 is a view showing a flowchart for selecting a storing mode when a wafer is stored.

After the unload lock chamber 6 is returned to the atmospheric pressure, the treated wafer 20 conveyed into the unload lock chamber 6 is taken out into the open air by the conveyer device 13 through the gate valve 12d, and if the wafer 20 is stored in the same cassette, as shown in the flowchart of FIG. 6, the wafer 20 is returned back to the initial position in the cassette 1a where it had been held at first as shown in FIG. 5A. Further, when an empty cassette is used as the cassette 1b so that the treated wafer is held in the cassette 1b, the wafer 20 that is taken out into the open air is held in the cassette 1b. At this time, when the wafer storing way is selected in a manner to store the wafer on the same stage in the cassette 1b as that in the cassette 1a, the wafer is stored on the same stage therein, as shown in FIG. 5B.

Further, please suppose that the wafer storing way is selected in a manner to store the wafer from the initial stage in the cassette to the stage vertically opposite to the initial one. In this case, when the number of stages of the cassette is D, and the stage from where the wafer is taken out is d1, then, the position d2 where the wafer is held is d2=D−d1. Accordingly, as shown in FIG. 5C, the wafers that are sequentially taken out from the side of the lower stage of the cassette 1a can then be held from the side of the upper stage to the side of the lower stage in the cassette 1b, whereby the untreated wafers and the treated wafers are less affected by foreign manners produced during the handling of the wafers. In holding the wafer in the cassette 1b, furthermore, the height at which the wafer-handling mechanism is inserted in the cassette 1b is determined based upon the height of the wafer support of the cassette 1b as described earlier, so that the wafer and the wafer support of the cassette 1b will not be interfered by each other.

When the wafers are stored in such a manner as shown in FIG. 5A, by repeating the above-mentioned operation, the untreated wafers held in the cassette 1a are all treated and are held again in the initial positions. The cassette 1a is then recovered and is replaced by another cassette holding untreated wafers. During this period, the apparatus is treating the untreated wafer in the cassette 1b or is treating the dummy wafer in the cassette 1c. When another cassette holding the untreated wafers is fed before the treatment for the cassette 1b is completed, then, the apparatus continuously operates without interruption. In this case, the cassette 1a and the cassette 1b are on the same horizontal flat plane, and the cassette 1a is recovered and another cassette holding the untreated wafers is fed without affecting access of the conveyer device 13 to the cassette 1b.

In the foregoing is described the case where the wafers taken out from the cassette 1a are returned to the initial positions of the cassette 1a and are continuously treated. Even when the wafers taken out from the cassette 1a are to be held in the cassette 1b, the apparatus can be continuously operated at all times in the same manner as described above by using five cassette plates, and using four cassettes in two pairs.

As the treatment is repeated, the reaction products adhere and deposit on the inner wall surfaces of the etching chambers 11. Therefore, the adhered matters must be removed by cleaning with plasma to restore the initial state. To carry out the cleaning with plasma, the dummy wafer 30 held in the cassette 1c is taken out by the conveyer device 13. Thereafter, the treatment is carried out quite in the same manner as the case of the above-mentioned wafer 20 to be treated, and the dummy wafer 30 is returned back to the initial position in the cassette 1c. Thus, the dummy wafer 30 is stocked in the cassette 1c at all times. When the dummy wafers 30 in the cassette 1c are all used for the plasma-cleaning, or when they are no longer usable after used several times, the dummy wafers 30 are all renewed together with the cassette 1c.

To check the state of foreign matters in the etching chambers 11 after the plasma-cleaning or the wet-cleaning, a wafer 40 for checking foreign matters is held in the cassette 1c. The wafer 40 for checking foreign matters held in the cassette 1c is then taken out by the conveyer device 13, treated quite in the same manner as that of the above-mentioned wafer 20 that is to be treated. Thereafter, the wafer 40 for checking foreign matters is returned back to the initial position in the cassette 1c. The wafer 40 for checking foreign matters after treated is inspected by an inspection device to examine the state of foreign matter in the etching chamber 11.

As described above, the cleaning with plasma and checking of foreign matters are not handled as special treatment sequence but are incorporated in the ordinary etching treatment and are carried out as a series of operations. The period for effecting the cleaning can be arbitrarily set. From the standpoint of hardware of the apparatus, there is no need of providing any special mechanism for effecting the cleaning with plasma or for checking foreign matters, but a cassette (1c in this embodiment) holding the dummy wafer 30 or the wafer 40 for checking foreign matters needs be placed on one (2c in this embodiment) of a plurality of cassette plates. When there is no need to effect the cleaning with plasma or to check foreign matters, a cassette holding the wafers 20 to be treated may be placed instead of the cassette holding the dummy wafer 30 or the wafer 40 for checking foreign matters in order to further increase the production efficiency.

The dummy wafer once used for the cleaning with plasma is returned back again to the initial cassette in the open air. In the vacuum treating chamber, therefore, the used dummy wafer never exists together with the untreated wafer that is to be subjected to the normal treatment and, hence, the product is not contaminated. Moreover, the used dummy wafer is returned back to the initial position in the cassette. Therefore, confusion is prevented between the used dummy wafer and the untreated dummy wafers or between the dummy wafer that is rarely used and the dummy wafer that is frequently used, making it possible to effectively use the dummy wafer for the cleaning with plasma without any inconvenience.

As described above, in the present invention, means for holding the substrates to be treated can be used for a plurality of applications, making it possible to select the cassettes and the wafer conveying system that meet the production line. Moreover, the product substrate is treated without affected by dust that results from the handling of wafers or from the treated substrate and that affects the untreated substrates.

What is claimed is:

1. A vacuum treating apparatus comprising: a treating chamber for treating a substrate in vacuum, a plurality of cassettes which hold substrates that are to be conveyed into said treating chamber, said cassettes each including a plurality of holding stages with substrate supports for holding substrates, a plurality of cassette stands for installing respective ones of said cassettes in horizontally spaced relation, mapping means for checking a stage of holding said substrates in said cassettes, means for conveying said substrates between said cassettes and said treating chamber, means which selects either that said substrate which is treated in said treating chamber be held in said cassette from which said substrate was taken out or that said substrate which is treated in said treating chamber be held in another cassette which is different from said cassette; and wherein said mapping means checks a height of a substrate support in each of said stages of said cassette for recovering said substrates into said cassette, when no substrate exists in said cassette.

2. A vacuum treating apparatus according to claim 1, wherein the substrates are taken out from only the stages of said cassette where the substrates exist depending upon the presence or absence of the substrates in said cassette.

3. A vacuum treating apparatus according to claim 1, wherein a holding stage of said another cassette in which the treated substrate is held is the same as the stage from which the substrate is taken out.

4. A vacuum treating apparatus according to claim 1, wherein a holding stage of said another cassette in which the treated substrate is held is opposite to the stage from which the substrate is taken out in the vertical direction.

* * * * *